United States Patent
Zimmerman et al.

(10) Patent No.: US 6,803,301 B2
(45) Date of Patent: Oct. 12, 2004

(54) FUSE CONFIGURATION WITH MODIFIED CAPACITOR BORDER LAYOUT FOR A SEMICONDUCTOR STORAGE DEVICE

(75) Inventors: Ulrich Zimmerman, Ottendorf-Okrilla (DE); Allen Chu, Chester, VA (US); Robert Trahan, Glen Allen, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 68 days.

(21) Appl. No.: 10/174,727

(22) Filed: Jun. 19, 2002

(65) Prior Publication Data

US 2003/0234435 A1 Dec. 25, 2003

(51) Int. Cl.⁷ .............................................. H01L 21/44
(52) U.S. Cl. ...................................................... 438/601
(58) Field of Search ................................. 438/131, 132, 438/215, 281, 333, 467, 600, 601; 257/209, 529

(56) References Cited

U.S. PATENT DOCUMENTS

| | | | | |
|---|---|---|---|---|
| 5,196,724 A | * | 3/1993 | Gordon et al. ............... | 257/530 |
| 5,493,144 A | * | 2/1996 | Bryant et al. ................ | 257/529 |
| 5,602,053 A | * | 2/1997 | Zheng et al. ................ | 438/600 |
| 5,831,325 A | * | 11/1998 | Zhang .......................... | 257/530 |
| 6,081,021 A | * | 6/2000 | Gambino et al. ............ | 257/530 |
| 6,097,077 A | * | 8/2000 | Gordon et al. .............. | 257/530 |
| 6,515,343 B1 | * | 2/2003 | Shroff et al. ................ | 257/530 |
| 2003/0164532 A1 | * | 9/2003 | Liu et al. ..................... | 257/529 |

* cited by examiner

Primary Examiner—Carl Whitehead, Jr.
Assistant Examiner—Jennifer M. Dolan

(57) ABSTRACT

A fuse configuration for a semiconductor storage device is provided. The fuse configuration includes a first electrode formed in a dielectric layer, the first electrode having a first cross-sectional area defined by a first perimeter; a fuse element, or isolating layer, for coupling the first electrode to a second electrode; and the second electrode having a second cross-sectional area defined by a second perimeter, the first perimeter of the first electrode being larger than the second perimeter. By employing this modified capacitor layout, the fuse element, or isolating layer, will never come into contact with an edge of the first electrode, and thus eliminate a high electric field region from the fuse layout and reliability issues of the prior art fuse configurations. A method for forming the fuse configuration is also provided.

8 Claims, 1 Drawing Sheet

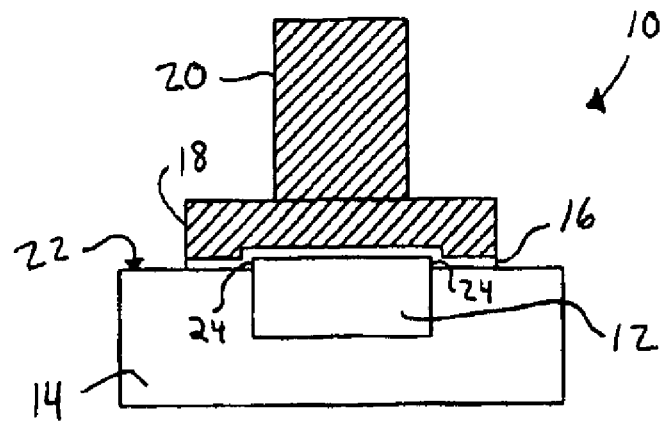
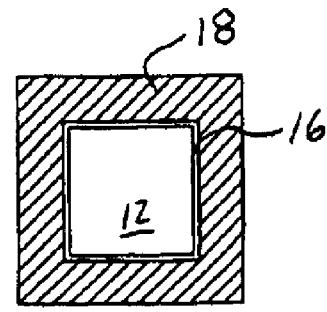
(PRIOR ART)
FIG. 1A
(PRIOR ART)
FIG. 1B
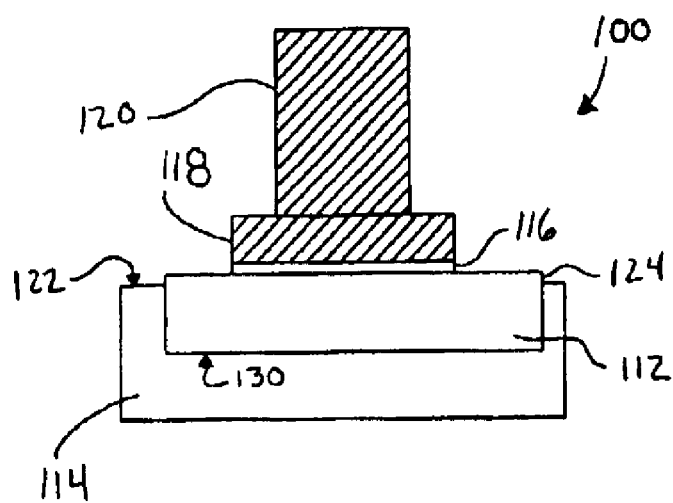
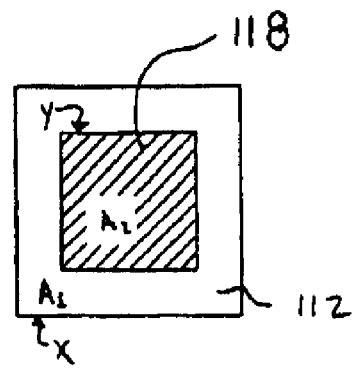
FIG. 2A
FIG. 2B

FUSE CONFIGURATION WITH MODIFIED CAPACITOR BORDER LAYOUT FOR A SEMICONDUCTOR STORAGE DEVICE

BACKGROUND OF THE INVENTION

1. Field of the Invention

The present invention relates generally to semiconductor device design, and more particularly, to a fuse configuration for a semiconductor storage device having a modified capacitor border layout and method of formation thereof.

2. Description of the Related Art

It is well-known to use fuses for permanent storage of data in semiconductor storage devices, i.e., memory devices, and for programming redundancy in semiconductor storage devices of this type. In the former case, the state of the fuse ("conducting" or "non-conducting") establishes a data value ("0" or "1"), while in the latter case, if there is a defective storage cell, a redundant storage cell is connected into the circuit by activating the fuse.

Fuses generally consist of a conducting layer, for example, doped polycrystalline silicon, TiN, Al, or a similar suitable material that can be blown or melted through the action of energy, by means of which a previously existing conducting connection is broken. It is, however, also conceivable to use a dielectric material as a fuse separating two interconnect layers. A conduction path is generated by breaking down a dielectric layer in a non-conducting state in order to create a conducting connection, i.e., a fused connection. The activation of energy may be brought about, for example, by irradiating a fuse with electromagnetic irradiation, or else simply by passing a relatively heavy current through a particular fuse, in order to cause it to melt.

Referring to FIGS. 1A and 1B, a conventional fuse configuration 10 for a semiconductor device is shown. The fuse configuration 10 includes a lower electrode 12, formed in a dielectric layer 14, a fuse element 16, and an upper electrode 18 connected to contact, or metal line, 20. Although not drawn to scale, the conventional layout of the fuse configuration 10 is constructed where the perimeter of the upper electrode 18 is larger than the perimeter of the lower electrode 12. FIG. 1B illustrates this concept with a bottom plan view of the fuse configuration with the dielectric layer 14 removed for clarity.

During the formation of the fuse configuration 10, lower electrode 12 is formed in dielectric layer 14 and a standard polish process, such as a chemical mechanical polishing (CMP), is performed to planarize surface 22 and remove any conductive material from the surface 22. However, as a result of the polishing process, the lower electrode 12 protrudes slightly from the dielectric layer 14, thus forming a little step 24 with a sharp metallic edge. This edge 24 exists along the entire perimeter of the lower electrode 12 and the fuse element 16 has its smallest thickness along this edge 24. When the fuse is employed as a non-conducting connection and voltage is applied to the fuse, leakage of current can occur at edge 24 or a relatively large electric field will be produced across the fuse element 16 at edge 24 and thus cause early breakdown and/or reliability issues of the fuse. For example, the fuse element 16 may breakdown causing a short to occur between the lower electrode 12 and upper electrode 18 rendering the connection unusable.

SUMMARY OF THE INVENTION

Accordingly, it is an aspect of the present invention to provide a fuse configuration for a semiconductor storage device and method of formation thereof which overcome the disadvantages of the prior art fuse configurations.

It is another aspect of the present invention to provide a fuse configuration which eliminates a concentrated high electric field region across a fuse element.

According to the present invention, a new and improved fuse configuration for a semiconductor storage device is provided. The fuse configuration includes a first electrode formed in a dielectric layer, the first electrode having a first cross-sectional area defined by a first perimeter; a fuse element for coupling the first electrode to a second electrode; and the second electrode having a second cross-sectional area defined by a second perimeter, the first perimeter of the first electrode being larger than the second perimeter.

According to another aspect of the present invention, a method for forming a fuse configuration for a semiconductor device is also provided. The method includes the steps of providing a first electrode having a first cross-sectional area defined by a first perimeter; and coupling the first electrode to a second electrode having a second cross-sectional area defined by a second perimeter, by a fuse element; the first perimeter being larger than the second perimeter. The providing a first electrode step further includes depositing a dielectric layer on a substrate of the semiconductor device; etching a cavity in the dielectric layer, the cavity being of the first cross-sectional area; depositing a first conductive material in the cavity to form the first electrode having the cross-sectional area of the cavity. The coupling step further includes the steps of depositing an isolating layer on the conductive material. Additionally, the coupling step further includes the steps of depositing a second conductive layer on the isolating layer; and processing the second conductive layer to form the second electrode having the second cross-sectional area.

BRIEF DESCRIPTION OF THE DRAWINGS

The above and other objects, features and advantages of the present invention will become more apparent from the following detailed description when taken in conjunction with the accompanying drawings in which:

FIG. 1A is a cross-sectional view of a fuse configuration for a semiconductor device in accordance with the prior art;

FIG. 1B is a bottom plan view of the fuse configuration shown in FIG. 1A with the dielectric layer removed to illustrate that the perimeter of the upper electrode is larger than the lower electrode;

FIG. 2A is a cross-sectional view of a fuse configuration for a semiconductor device in accordance with the present invention; and FIG. 2B is a top plan view of the fuse configuration shown in FIG. 2A to illustrate that the perimeter of the first electrode is larger than the second electrode in accordance with the present invention.

DETAILED DESCRIPTION OF THE PREFERRED EMBODIMENTS

A preferred embodiment of the present invention will be described herein below with reference to the accompanying drawings. In the following description, well-known functions or constructions are not described in detail since they would obscure the invention in unnecessary detail.

Referring to FIGS. 2A and 2B, in which like reference numerals identify similar or identical elements throughout the several views, a new and improved fuse configuration 100 for a semiconductor storage device is provided. The fuse configuration 100 includes a first electrode 112 formed in a dielectric layer 114, the first electrode 112 having a first cross-sectional area $A_1$, defined by first perimeter x; a fuse element, or isolating layer, 116 for coupling the first electrode 112 to a second electrode 118; and the second electrode 118 having a second cross-sectional area $A_2$, defined by second perimeter y, the first cross-sectional area, $A_1$, of the first electrode 112 being larger than the second cross-sectional area, $A_2$. By employing this modified capacitor layout, the fuse element, or isolating layer, 116 will never come into contact with an edge of the first electrode 112, as described above, and thus eliminate the high electric field region from the fuse layout and reliability issues of the prior art fuse configurations.

It is to be understood that perimeter x of the first electrode 112 is larger than perimeter y of the second electrode 118 such that the first electrode 112 covers the entire perimeter y of the second electrode 118. By forming perimeter x larger than perimeter y, the second electrode 118 and fuse element 116 will not cross edge 124 of the first electrode 112 resulting in a fuse element 116 of fairly uniform thickness thus eliminating thinning of the fuse element 116 and possible breakdown.

The fuse configuration 100 is typically formed on a semiconductor substrate, which may include silicon, silicon-on-insulator, gallium arsenide or other substrates known in the art, not shown. The dielectric layer 114, preferably silicon dioxide, is deposited on the substrate by a chemical vapor deposition (CVD) process, a plasma enhanced chemical vapor deposition (PECVD) process, or any known process in the art. The dielectric layer 114 may also be formed from BPSG, BSG, or TEOS. The dielectric layer 114 is then etched through any one of the various known-etching techniques to form fuse cavity 130. The first electrode 112 is formed by depositing a first conductive layer in the cavity 130 and over the dielectric layer 114. The conductive layer may be formed by any suitable material known in the art, such as Al, Cu, W, doped poly-Silicon, etc. It is to be understood that cavity 130 is etched to correspond to a cross-sectional area, $A_1$, of the first, or lower, electrode. A standard polish process, such as a chemical mechanical polishing (CMP), is then performed to planarize surface 122 and remove any conductive material from the surface 122.

Fuse element 116 is then formed by depositing an isolating layer on surface 122. The isolating layer may be $SiO_2$, SiN or any suitable material known in the art. A second conductive layer is then deposited over the isolating layer to eventually form the second electrode 118. The second electrode 118 may be formed from the same materials as the first electrode. Through a masking and etching process, the fuse element 116 and second electrode 118 are processed to have a cross-sectional area, $A_2$, which is smaller than the cross-sectional area, $A_1$, of the first electrode 112. It is to be understood that the isolating layer may be masked and etched before the second metal layer is deposited. Optionally, a third metal layer may be deposited to form metal line 120 which couples the second electrode 118 to a circuit of the semiconductor device.

Additionally, the dielectric integrity of the fuse configuration 100 can be further enhanced by an appropriate oxidation and/or nitridation of the fuse stack periphery that has been exposed by the dry and/or wet etching process steps in laterally patterning the fuse stack. For example, the corner of the second or upper electrode 118 in contact with fuse element 116 can be rounded through an oxidation to reduce the electric field across fuse element 116 at this point, thus increasing dielectric integrity.

By constructing the fuse configuration 100 with the modified capacitor layout, i.e., having the perimeter of the first electrode larger than the perimeter of the second electrode, conventional process techniques can be employed to produce a fuse configuration with high reliability. The fuse configuration of the present invention may be used for capacitor or resistor trimming, ROM programming, chip ID, DRAM redundancy activation, etc.

While the invention has been shown and described with reference to a certain preferred embodiment thereof, it will be understood by those skilled in the art that various changes in form and detail may be made therein without departing from the spirit and scope of the invention as defined by the appended claims.

What is claimed is:

1. A method for forming a fuse for a semiconductor device comprising the steps of:

providing a first electrode having a first cross-sectional area defined by a first perimeter in a dielectric layer, said first electrode protruding from the dielectric layer such that a step edge exists along the first perimeter; and coupling the first electrode to a second electrode by a fuse element, wherein the second electrode has a second cross-sectional area defined by a second perimeter, the first perimeter being larger than the second perimeter, and said fuse element being arranged such that it is not in contact with said step edge.

2. The method as in claim 1, wherein the providing a first electrode step further comprises the steps of:

depositing a dielectric layer on a substrate of the semiconductor device;

etching a cavity in the dielectric layer, the cavity being of the first cross-sectional area;

depositing a first conductive material in the cavity to form the first electrode having the cross-sectional area of the cavity.

3. The method as in claim 2, wherein the providing a first electrode step further comprises the step of:

polishing the first conductive material to planarize its surface.

4. The method as in claim 1, wherein the coupling step further comprises the steps of:

depositing an isolating layer on the first electrode; and processing the isolating layer to form the fuse element.

5. The method as in claim 4, wherein the coupling step further comprises the steps of:

depositing a second conductive layer on the isolating layer; and processing the second conductive layer to form the second electrode having the second cross-sectional area.

6. The method as in claim 4, further comprising the steps of:

depositing a third conductive layer on the second electrode; and processing the third conductive layer to form a conductive line for coupling the second electrode to a circuit of the semiconductor device.

7. The method as in claim 1, wherein the coupling step further comprises the steps of:

depositing an isolating layer on the first electrode;

depositing a second conductive layer on the isolating layer; and processing the second conductive layer to form the second electrode having the second cross-sectional area.

8. The method as in claim 7, further comprising the steps of:

depositing a third conductive layer on the second electrode; and processing the third conductive layer to form a conductive line for coupling the second electrode to a circuit of the semiconductor device.

* * * * *